Oct. 24, 1967 H. PATALONG 3,349,296

ELECTRONIC SEMICONDUCTOR DEVICE

Filed Oct. 26, 1962 2 Sheets-Sheet 1

United States Patent Office 3,349,296

Patented Oct. 24, 1967

3,349,296
ELECTRONIC SEMICONDUCTOR DEVICE

Hubert Patalong, Ebermannstadt, Germany, assignor to Siemens-Schuckertwerke Aktiengesellschaft, Berlin-Siemensstadt, Germany, a corporation of Germany Filed Oct. 26, 1962, Ser. No. 233,282
Claims priority, application Germany, Oct. 31, 1961, S 76,483
11 Claims. (Cl. 317—234)

My invention relates to rectifiers, transistors, photocells and other electronic devices comprising an essentially monocrystalline body of silicon or other semiconductor material in broad-area connection with a metal contact of good electrical and thermal conductance, and in a more particular aspect to encapsulated semiconductor devices in which one of such metal contacts forms part of a heat-sink structure, such as a block of copper.

There are known semiconductor devices in which the current supply contacts are fastened to the semiconductor body not by alloying, soldering or other fusion junctions, but are merely held against the semiconductor surface under mechanical pressure. In some cases such contacts consist of an S-shaped tungsten whose tip is placed upon the semiconductor surface to form therewith a rectifying or barrier-free contact. By passing an electric current surge through the connection, the wire tip can be welded to the semiconductor body.

When such semiconductor devices are subjected to excessive electrical loading or alternating thermal stresses, the area of engagement between contact and semiconductor material conducts current only at singular points, this may result in overloading the points of contact and thus damaging or destroying the semiconductor device. Such semiconductor devices, therefore, have been produced and employed only with current supply contacts having a maximum contact area of about 1 mm.$^2$.

It is an object of my invention to obviate the above-mentioned disadvantage and limitation of the known pressure-contacted semiconductor devices and to provide a reliable and permanent pressure-contact connection between the semiconductor body and a metallic contact member that affords giving such devices a higher current or power rating than heretofore applicable with pressure-contacted semiconductors.

Another, more specific object of the invention is to secure a reliable connection between these two components and to preserve a good thermal and electrical contact engagement even if the semiconductor device is subjected to frequently changing electrical loads or frequent changes in temperature conditions.

It is also an object of the invention to obtain reliable protection from damage of the semiconductor device due to differences in thermal expansion while doing away with the necessity of using for this purpose a soldered or other fusion bond between the semiconductor body and a relatively thick plate of metal having substantially the same thermal coefficient of expansion as the semiconductor substance. That is, while in known devices a molybdenum plate of about the same or greater thickness than a rectifier disc of silicon has been fusion-bonded to the silicon for establishing electric and thermal contact with adjacent conductors, it is a more specific object of my invention to make such fixed or fusion bond with a relatively thick plate of molybdenum or the like metal unnecessary to thereby reduce the manufacturing work and cost.

To achieve these objects as well as those mentioned hereinafter, I provide a substantially monocrystalline semiconductor body, such as a plate of silicon, with a contact member that has a planar surface in engagement with a planar area of the semiconductor body, and I give the area of mutual engagement a minimum size of about 10 mm.$^2$, and equip the device with pressure means that maintain between the semiconductor body and the adjacent metallic contact member an area pressure of more than 50 kilograms per square centimeter, preferably a pressure of more than 100 kg./cm.$^2$ up to 500 kg./cm.$^2$. Preferably, at least one of the two mutually engaging contact surfaces has uniform roughness over the entire contact area, and a roughness depth between 0.5 and 50 microns, preferably between 1 and 3 microns, and each of the two contact surfaces is planar to such a high degree than any departures of the medium surface from a geometric plane are not larger than the roughness depth.

By virtue of such a pressure-contact connection between the semiconductor body and the adjacent heat-sink or other metal structure, the two pressure-engaged contact surfaces can laterally glide with respect to each other in directions approximately perpendicular to the current-flow direction, so that any different amounts of thermal elongation, as may occur during operation of the semiconductor device, are compensated by relative gliding motion without causing the occurrence of appreciable mechanical tension. It has been found that even in the event of frequent changes in load current between the zero value and the permissible maximum, the good contact properties with respect to conductance of electric current and heat, remain substantially preserved and invariable permanently.

On the contrary, it has been observed that these properties improve during operation of the semiconductor device. This can be explained as follows. Initially a multitude of individual point contacts are formed between the two mutually engaging contact surfaces due to their roughness, the singular contacts being due to protuberances of one surface touching the other. During operation of the semiconductor device the protuberances gradually become flattened due to the lateral displacements then occurring under the high mechanical contact pressure. Hence the total effective area of contact gradually increases. This explanation is in harmony with the further observation that the contact surfaces, originally of dull appearance, become shiny when inspected after some period of operation, and that their brilliance increases from the middle toward the perimeter in accordance with the outwardly increasing path lengths of the relative thermal expansions.

The foregoing and other objects, advantages and features of my invention, said features being set forth with particularity in the claims annexed hereto, will be apparent from, and will be mentioned in, the following with reference to the accompanying drawings in which:

Figure 1:
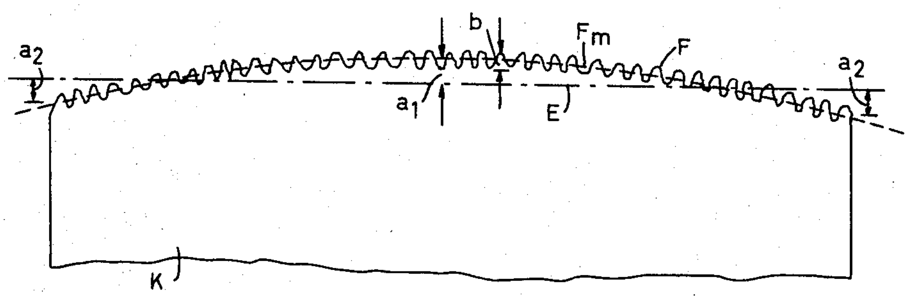
FIG. 1 is explanatory and shows diagrammatically a sectional view of a contact surface for the purpose of demonstrating the terms "roughness depth" and "median surface."

Denoted in FIG. 1 by K is a portion of a pressure contact whose contact surface F is uniformly rough. The illustration is on a greatly enlarged scale, the vertical dimensions being much more enlarged than the horizontal ones to make the roughness more clearly apparent.

The "roughness depth" is indicated by the distance $b$ between the bottom of a groove and the most outwardly protruding point or crest of an adjacent projection, and denotes the depth value averaged over the entire contact surface F in the assumption that the individual depth values do not essentially depart from each other on account of the uniformity of the roughness.

The "median surface" $F_m$, represented by a broken, curved line, is developed from the rough surface F by observing the condition that the total volume of all recesses below the surface $F_m$ is equal to the total volume of all projections protruding upwardly beyond the surface $F_m$. Drawn through the median surface $F_m$ is a geometric plane E which extends perpendicularly to the plane of illustration and is indicated by a dot-and-dash line. This plane is so located that the departures of the median surface $F_m$ above and below the plane E are of equal size. The largest departure of the surface $F_m$ from the plane E upwardly is denoted by $a_1$ and is located at about the middle of the contact surface F. The largest departures of the surface $F_m$ from the plane E downwardly are located at the two outer edges of the contact surface and are denoted by $a_2$. In other words, the position of the plane E is defined by the condition that $a_1=a_2$. Any rounding of the edges is disregarded by the extrapolating the broken line $F_m$ toward both edges with the same amount of curvature as in the adjacent, not appreciably rounded circular or annular zone of the contact surface. The intersections of these extrapolated extensions with the lateral (vertical) boundary lines of the contact K thus constitute one end point for determining the dimensions $a_2$, whose other end point is determined by the geometric plane E.

Since the amounts of departure $a_1$ and $a_2$, as shown in FIG. 1, are larger than the roughness depth $b$, it will be recognized that the contact surface F, as diagrammatically represented in FIG. 1, would not satisfy the requirements of the invention.

Figure 2:
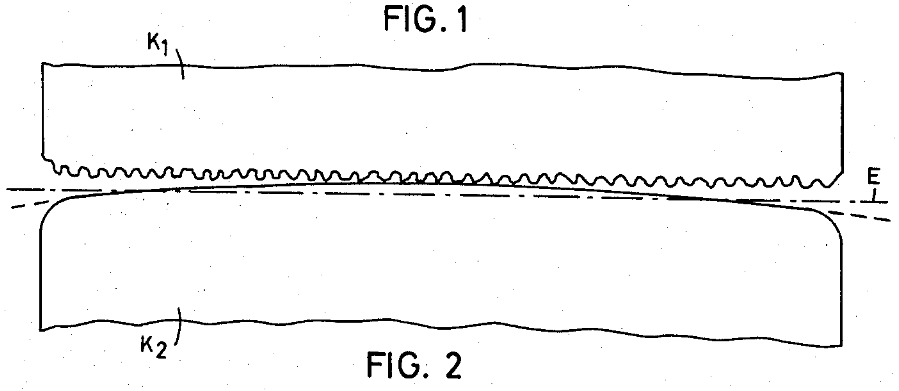
FIG. 2 is an explanatory and diagrammatic showing of a pressure-contact connection according to the invention in a representation similar to that of FIG. 1.
Figure 3:
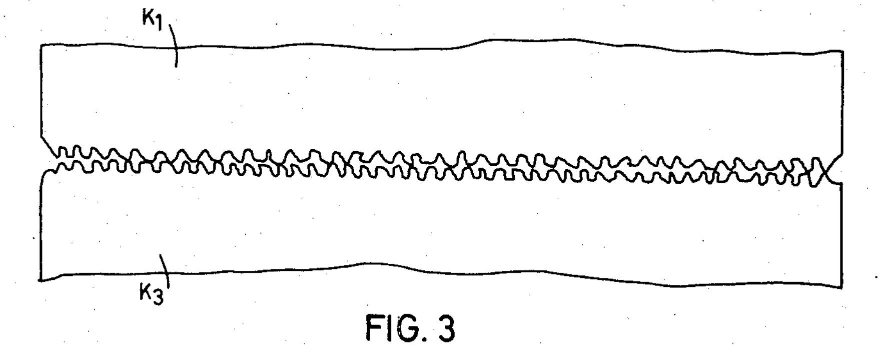
FIG. 3 shows, in similar diagrammatic form, a modification of a pressure-contact connection according to the invention.

In contrast thereto, the pressure-contact conditions to be met by a semiconductor device according to the invention are satisfied by the contact $K_1$ of which a portion is shown in each of FIGS. 2 and 3 on a similar scale and in the same manner as in FIG. 1. The contact surface of contact $K_1$ in FIG. 2 or FIG. 3 is virtually planar. The planar shape can be produced by an optical grinding method or by the same lapping method as conventionally employed for preparing or finishing semiconductor wafers of silicon or germanium. The lapping of the contact surface is performed by employing a lapping agent or abrasive of such a fine granulation that the prescribed roughness depth is secured. For this purpose the type of oil usually employed for the lapping of semiconductor wafers can also be used as auxiliary lapping agent. The use of glycerine as auxiliary lapping agent has been found particularly favorable because it can be easily rinsed off with distilled water.

The above-mentioned contact member $K_1$ according to FIG. 2 or 3 may be identical with the above-mentioned semiconductor body, such as a wafer of silicon. The cooperating contact $K_2$ or $K_3$ according to FIGS. 2 and 3 of the pressure-contact connection, still to be described more in detail, may be made of silver. Instead of silver, other noble metals, such as gold or platinum, can be employed.

In an embodiment preferred on account of its particular simplicity and advantage, the contact $K_1$ consists, as mentioned, of the semiconductor body, whereas the contact $K_2$ or $K_3$ consists, at least at its contacting surface, of silver and constitutes a component of a base plate or other heat-sink structure of copper.

As shown in FIG. 2, the contact surface of contact member $K_2$ has less roughness than the contact surface of member $K_1$. This is the case, for example, when the contact surface of member $K_2$ is smoothed by polishing. As a rule, such surface treatment causes the polished surface to become convex and to assume a rounded outer edge as diagrammatically illustrated in FIG. 2. Such curvature at the edges is not detrimental from the viewpoint of the invention, if the departures of the polished contact surface on both sides of a geometric plane E are not larger than the roughness depth of the other contact surface. This condition is satisfied, according to FIG. 2, neglecting the rounded outer edge as explained above with reference to FIG. 1. In this case, and assuming a sufficient magnitude of contact pressure is applied, virtually the entire contact surface can be considered to be active in supporting the current flow because the contact pressure causes the occurrence of a corresponding, partly permanent and partly elastic, deformation of the projections on the counter contact surface $K_1$. The increased curvature at the very edges merely reduce the effective contact surface by a corresponding narrow marginal zone.

According to FIG. 3, the contact surface of the lower contact $K_3$ is likewise lapped by means of a sufficiently fine-granular grinding powder, thus avoiding a bulging of the contact surface as well as a curvature at the outer edges.

As mentioned, the contact $K_2$ or $K_3$ preferably forms part of a terminal or heat-sink body of copper which serves for supplying electric current and may also contribute to dissipating generated heat from the semiconductor member. If such a body of copper is provided with a silver coating on the contact surface, the relatively high rate of diffusion of copper in silver poses the problem that when the silver coating is relatively thin, an appreciable amount of copper may diffuse up to the contact surface after an operating period of longer or shorter duration. Such migration of copper through the silver to the contact surface tends to appreciably impair the properties of the semiconductor material by copper diffusing into that material. To avoid such impairment the silver coating must have a sufficient thickness. It has been found that a thickness of 0.05 and 0.3 mm. is satisfactory. Within this range, the value to be chosen is higher, the greater the expectable frequency of changes in electrical load. The smallest value of thickness is usually sufficient in rectifier diodes for feeding electrolytic baths and other electric loads of uniform current consumption, whereas higher thickness values, up to the upper limit of the mentioned range, are preferable, for example, in power rectifiers for use on vehicles and for rectifiers to be employed in welding apparatus.

Silver coatings of such a relatively large thickness are rather difficult to produce by electrolytic or electrophoretic means, particularly in view of the necessary uniformity in thickness over a rather large contact area. As a rule, therefore, these coating methods are unfavorably intricate and time-consuming. It is easier and preferable to place between the contact surfaces a silver foil produced by rolling with uniform foil thickness. Such a silver foil, preferably annealed in vacuum before employing it, can readily be bonded to that portion of the pressure-contact connection that consists of copper or other metal readily alloyable with silver. The bonding can then be effected by moderately heating the silver foil between the contact surfaces, whereafter the silver foil becomes area-bonded to the alloyable metal. The above-mentioned high diffusion rate of copper in silver is desirable in this case because it promotes the fastening and joining of the silver layer to the copper structure by diffusion.

The moderate heating just mentioned can be effected in a separate processing step while the pressure-contact assembly is being subjected to sufficient pressure. Since the temperature required for this purpose can be kept lower than the maximum permissible operating temperature of the semi-conductor device, the silver foil can also be fastened to the copper body by simply subjecting the finished semiconductor device to a preliminary operation at essentially constant load, or also by placing the semiconductor device into electric operation but making certain that at least initially the changes in alternating load are kept within small limits.

The area pressure between the two contact surfaces of the pressure-contact connection is to be at least 50 kg./cm.$^2$ and is preferably between 100 and 500 kg./cm.$^2$ of the contact area. A pressure near the lower limit is sufficient if the two contact surfaces, on the average, depart little from a geometric plane. Consequently for contacting conditions according to FIG. 2, a pressure magnitude near the upper limit of the mentioned range is preferable, whereas a contact device according to FIG. 3 or similar devices do not require more than a pressure magnitude near the lower limit.

The numerical data given in the foregoing relate essentially to the use of silver as noble metal. For other noble metals, such as gold and platinum, the data exemplified for the above-described devices can readily be modified analogously in accordance with the known properties of these metals.

It is preferable to have the semiconductor body bordered on both plate sides by such a pressure contact and, consequently, to provide the monocrystalline semiconductor body with two parallel surfaces against which two current supply contact members respectively are forced under a pressure of about 100 to 500 kg./cm.$^2$. However, the invention can also be applied by providing such a pressure contact connection on only one side of the semiconductor body, whereas the other side of the body is connected in the conventional manner by alloying, soldering or the like. In the latter case it is preferable to face the semiconductor body at the side of the alloyed or soldered joint with a carrier plate consisting of a metal whose thermal coefficient of expansion is similar to that of the semiconductor material. Suitable for this purpose, for example, is molybdenum if the semiconductor body consists of silicon or germanium. Also applicable as carrier metal in such cases is tungsten or chromium. The carrier plate is fusion-bonded, for example, by a solder layer, with the semiconductor body in face-to-face relation thereto.

It has been found advisable to treat the semiconductor body at the pressure-contact surface so that it exhibits metallic or quasi-metallic conductance. For this purpose, for example, the semiconductor can be doped at this area to such a high degree that it is virtually metallically conducting. Accordingly, the dopant concentration at the semiconductor surface to be subjected to the pressure engagement is preferably given a minimum concentration of about $10^{20}$ atoms per cm.$^3$. The dopant concentration may decrease continuously or abruptly toward the interior of the semiconductor body. For example, with boron-doped silicon, the boron content at the contact surface can thus be kept above the stated limit. The same applies, if antimony is used as a dopant.

Another possibility of providing for metallic conductance at the pressure-engaged semiconductor surface is to metallize this surface. For this purpose a thin metal coating, preferably 5 to 10 microns thick, can be deposited. Suitable, for example, is a nickel coating deposited chemically, electrolytically, by cementation, vapor deposition or any other way. Similar depositing methods can be employed for coating the semiconductor surface with gold or silver. Other metals such a palladium, gallium, aluminum and indium can likewise be used and are preferably precipitated by vaporization in thin layers upon the semiconductor material. Another possibility for depositing such a thin metal coating is to simply rub gallium, having a very low melting point, mechanically onto the semiconductor surface. It is preferable, however, to limit the last-mentioned expedient to p-conducting surface areas of the semiconductor body, whereas a thin nickel coating has been found particularly advantageous for the barrier-free contacting of n-type areas.

It will be understood that such metallic skin or metallization of the semiconductor surface differs from the above-mentioned provision of a fusion-bonded, rather thick plate of molybdenum in that the metallization or other coating has but a very slight thickness such as from a fraction of one percent to a few percent of the semiconductor thickness, and requires no soldering or similar fusion bonding nor independent rigidity nor equality of thermal expansion relative to the semiconductor.

Figure 4:
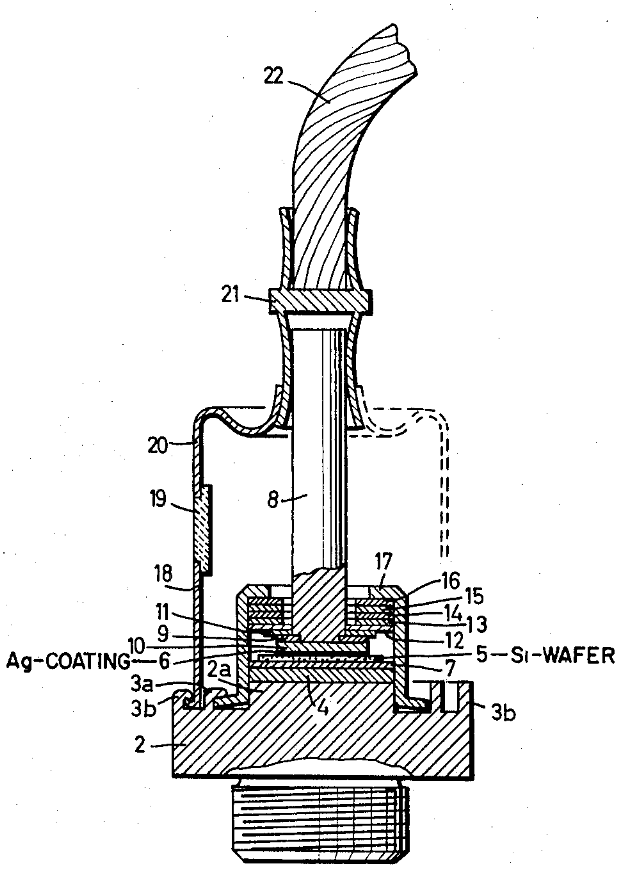
FIG. 4 is a sectional view of a silicon power rectifier of the diode type embodying the invention by way of example.

The encapsuled rectifier illustrated in FIG. 4 comprises a massive copper block 2 of circular shape which has an integral threaded bolt and serves as a heat-sink structure. The copper block 2 is provided with a central projection 2$a$ to which a plate 4 of molybdenum is hard-soldered. An annular projection 3$a$ concentrically surrounding the projection 2$a$ serves for fastening a cup-shaped holder 17. An annular concentric edge portion 3$b$ of the copper block, protruding upwardly in concentric relation to the projection 2$a$, serves for fastening a housing portion of the capsule to the copper block, as will be more fully described below. Mounted on the central projection 2$a$ is the main component, namely the semiconductor plate 5.

The semiconductor plate 5 may consist of a semiconductor member produced by diffusion, by epitaxial growth, or by pulling a crystal from a melt, for example according to the Czochralski method. One of the suitable ways of production is the following. A semiconductor disc of a given type of conductance is used as a carrier or substratum for pyrolytic or epitaxial dissociation and precipitation of a gaseous compound of the same or a different semiconductor material. In this manner, a crystalline layer is grown on the substratum. During growth or thereafter, the layer is doped to possess the opposite type of conductance. This results in a semiconductor member of the p-n junction type. When pulling a crystal out of a melt in accordance with the Czochralski method, a desired sequence of layers having suitable types of conductance can be produced by controlled addition of dopant impurities to the growing crystal. A monocrystal, for example of germanium, pulled and grown in this manner, can be cut along the sequence of layers into a large number of individual plural-layer semiconductor members.

Described presently is a specific example of producing a semiconductor disc 5 as employed in the encapsulated device according to FIG. 4. The production is in accordance with the diffusion principle. Employed as starting material is high-ohmic p-type silicon having a specific resistance higher than 200 ohm cm. The silicon material is used in form of a circular disc of about 500 microns thickness and 18 mm. diameter. The silicon disc is tempered for 16 hours at 1280° C. in an atmosphere of $P_2O_5$. Thus, phosphorus is diffused from all sides into the disc. Some oxidation of the surface also occurs and can be continued after the tempering treatment is terminated. Thereafter one of the flat sides of the semiconductor disc is lapped down to a thickness of about 380 microns. Due to the diffusion treatment the semiconductor disc possesses a p-type core consisting of the original material, surrounded on all sides by an n-type zone. The lapping operation exposes the p-type core on one side. Thereafter the disc is tempered for 16 hours at 1280° C. in an atmosphere of $BI_3$ so that boron diffuses into the semiconductor body. Diffusion takes place only at the non-oxidized surface previously exposed by lapping. Thereafter the peripheral edge of the semiconductor disc is eliminated by chemical etching. This can be done on a so-called etching centrifuge on which the semiconductor disc is rotated about its symmetry axis while a jet of etching agent, such as a mixture of hydrofluoric acid and fuming nitric acid in the ratio 1:1, is directed onto the edge of the disc. Thereafter the two flat sides of the semiconductor disc are lapped to planar and parallel shapes, the lapping medium being chosen to obtain a roughness depth of 0.5 to 50 microns, preferable 1 to 3 microns.

According to FIG. 4, the semiconductor plate 5 rests upon the molybdenum plate 4, a thick silver layer 7 being interposed. The silver layer 7 consists of a foil having 100 to 200 micron thickness.

The foil 7 is preferably provided on both sides with a raised pattern, for example a waffle pattern similar to the knurling of knurled knobs. According to a preferred embodiment, the silver foil is first annealed and subsequently etched, for example with the aid of nitric acid, whereby a fine etching pattern on the surface is produced. Placed on top of the semiconductor plate 5 is a plunger-shaped member. Before being assembled with the rectifier sandwich, this member is preferably composed of its individual components, namely a copper pin 8, a washer 9 of copper and a disc 10 of molybdenum. The three parts 8, 9, 10 are firmly joined with each other. This can be done by hard-soldering. The bottom side of the molybdenum disc 10 is preferably provided with a silver coating 6, and is thereafter lapped to planar shape.

Positioned on the plunger-shaped member are a washer 11 of steel, a disc 12 of mica, another washer 13 of steel, and three ring-shaped springs 14, 15 and 16. The springs have curved shape when not under pressure. After assembling these parts, a bell-shaped holder 17 is placed over the copper pin 8. The holder 17 has a bottom flange which is thereafter fastened to the copper body 2 by bending the projection 3*a* from the straight shape shown on the right-hand side of FIG. 4 to the deformed shape shown at the left-hand side. The upper part of the holder 17 constitutes an abutment for the disc springs 14, 15, 16 which, in assembled condition of the semiconductor device, are compressed to planar shape and then provide the necessary contact pressure.

As apparent from FIG. 4, a device according to the present invention affords an extremely compact design in which all component parts are accurately secured in proper position to one another and therefore cannot become displaced by mechanical jarring or thermal displacements. Essential in this respect is the function of the mica disc 12 which serves for electrically insulating the holder 17 from the topside of the semiconductor as well as for centering the pin 8. For this purpose the outer edge of the mica disc 12 abuts against the cylindrical inner wall of the holder 17, and the inner edge of the mica disc 12 touches the copper pin 8.

The assembling work is completed by placing a bell-shaped housing portion, composed of individual parts 18, 19, 20 and 21, over the entire arrangement so far described. As its lower rim, the part 18 has an outwardly projecting flange which is fastened to the copper block 2 by deforming the marginal projection 3*b* of the block, shown in original shape at the right-hand side of FIG. 4 and in ultimate shape at the left-hand side. The copper pin 8 is joined with the housing by compressing the part 21 firmly against the top portion of pin 8. The part 21 preferably consists of copper, whereas the parts 18 and 20 consist of steel or an iron-nickel-cobalt alloy such as available in the trade under the trade names Kovar or Vacon. Parts 20 and 21 are soldered or welded to each other. Part 19 is insulating and preferably consists of ceramic material. It is metallized at those places where it is joined with parts 18 and 20 so that they can be joined with part 19 by soldering. A cable 22, inserted in the part 21 from the outside, is joined therewith by a compression connection.

It will be understood that the semiconductor member proper may have a constitution and design other than illustrated and described. For example, the semiconductor body may consist of germanium. The carrier plate 4 may consist, for example, of certain highly alloyed types of steel, particularly those containing nickel and cobalt, which possess a similar coefficient of expansion as the semiconductor material, such as germanium or silicon. The semiconductor body may also consist of silicon carbide or of an intermetallic (III–V) compound of respective elements from the third and fifth groups respectively of the periodic system of elements, or the semiconductor body may consist of a (II–VI) compound of respective elements from the second and sixth groups of the periodic system, semiconductor compounds of these types, as well as electrode and carrier-plate metals suitable therefor being known for such purposes (for example, from the book, Semiconductors, edited by N. B. Hannay, published 1959 by Reinhold Publishing Corp., New York, chapter 9 and appertaining bibliography).

Another advantage of the invention as described in the foregoing resides in the fact that the semiconductor member 5 can also be inserted into the capsule in reversed electric orientation. This affords providing semiconductor diodes which have respectively different polarities but the same external design, the same electric characteristics, and also a similar internal design.

While the above-described embodiments relate to rectifier diodes, it will be obvious that the invention is not limited thereto but is also applicable to other semiconductor diodes with and without p-n junction, as well as to semiconductor triodes, such as transistors, four-layer devices of the p-n-p-n type such as semiconductor controlled rectifiers or switching devices, photoelements and phototransistors, and also in multiple-component devices in which a plurality of such diodes and/or triodes are combined in a single semiconductor body.

Upon a study of this disclosure, such and other modifications with respect to design, number of components, and materials will be obvious to those skilled in the art and are indicative of the fact that my invention can be given embodiments other than particularly illustrated and described herein, without departing from the essential features of the invention and within the scope of the claims annexed hereto.

I claim:

1. An electronic semiconductor device, comprising a substantially monocrystalline body and a metal contact member, said monocrystalline body consisting of semiconductor material and having a planar surface, said contact member having a planar surface in mechanical face-to-face pressure engagement with the planar surface of said monocrystalline body, and housing means including pressure maintaining means holding said contact member and said monocrystalline body in said face-to-face pressure engagement, the area of said pressure engagement being at least 10 mm.$^2$ and the maintained pressure (higher) greater than 50 kg. per cm.$^2$.

2. An electronic semiconductor device, comprising a substantially monocrystalline body of silicon and a metal contact member, said monocrystalline body consisting of semiconductor material and having a planar surface, said contact member having a planar surface in mechanical face-to-face pressure engagement with the planar surface of said monocrystalline body, and housing means including pressure maintaining means holding said contact member and said monocrystalline body in said face-to-face pressure engagement, the area of said pressure engagement being at least 10 mm.$^2$ and the maintained pressure between about 100 and 500 kg./cm.$^2$.

3. An electronic semiconductor device, comprising a substantially monocrystalline body and a metal contact member, said monocrystalline body consisting of semiconductor material and having a planar surface, said contact member having a planar surface in mechanical face-to-face pressure engagement with the planar surface of said monocrystalline body, and housing means including pressure maintaining means holding said contact member and said monocrystalline body in said face-to-face pressure engagement, the area of said pressure engagement being at least 10 mm.$^2$ and the maintained pressure greater than 50 kg./cm.$^2$, at least one of said two planar surfaces being uniformly rough and having a roughness depth between 0.5 and 50 microns, each of said two planar surfaces having any departure of its median surface in either direction from a geometric plane within the limit of said roughness depth.

4. An electronic semiconductor device, comprising a substantially monocrystalline body of plate shape having a planar surface on each opposite plate side respectively and a pair of metal contact members, said monocrystalline body consisting of semiconductor material and said planar surfaces being parallel, each of said contact members having a planar surface in mechanical face-to-face pressure engagement with a corresponding one of the planar surfaces of said monocrystalline body, and housing means including pressure maintaining means holding said contact members and said monocrystalline body in said face-to-face pressure engagement, the maintained pressure being about 100 to 500 kg./cm.$^2$ and the area of said pressure engagement of each of said contact members and said monocrystalline body being at least 10 mm.$^2$.

5. An electronic semiconductor device according to claim 1, wherein said contact member has at said area of pressure engagement a silver coating of 0.05 to 0.3 mm. thickness.

6. An electronic semiconductor device according to claim 1, wherein said contact member has at said area of pressure engagement a silver coating of 0.05 to 0.3 mm. thickness consisting of silver foil annealed in vacuum.

7. An electronic semiconductor device according to claim 1, wherein said contact member consists of metal having substantially the same thermal coefficient of expansion as said monocrystalline body.

8. An electronic semiconductor device according to claim 1, wherein said contact member consists of molybdenum.

9. An electronic semiconductor device according to claim 1, wherein said monocrystalline body has a metal coating in said area of pressure engagement.

10. An electronic semiconductor device according to claim 4, wherein said monocrystalline body is formed of substance selected from the group consisting of germanium and silicon and has p-type conductance at one of the two areas of pressure engagement, and said monocrystalline body has a coating of gallium on said one of said areas of pressure engagement.

11. An electronic semiconductor device according to claim 1, wherein said monocrystalline body has at said area of pressure engagement a dopant concentration of at least $10^{20}$ atoms/cm.$^3$.

References Cited

UNITED STATES PATENTS

| | | | |
|---|---|---|---|
| 2,244,771 | 6/1941 | Figour | 317—238 |
| 2,504,628 | 4/1950 | Benzer | 317—239 |
| 2,751,528 | 6/1956 | Burton | 317—234 |
| 2,957,112 | 10/1960 | Sils | 317—234 |
| 3,059,157 | 10/1962 | English et al. | 317—234 |
| 3,128,419 | 4/1964 | Waldkatter et al. | 317—234 |
| 3,204,158 | 8/1965 | Schreiner et al. | 317—234 |
| 3,228,104 | 1/1966 | Emeis | 317—234 |

JAMES D. KALLAM, *Primary Examiner.*

JOHN W. HUCKERT, *Examiner.*